(12) United States Patent
Carinci et al.

(10) Patent No.: US 10,557,903 B2
(45) Date of Patent: Feb. 11, 2020

(54) SLICE MULTIPLEXING METHOD AND APPARATUS FOR MAGNETIC RESONANCE IMAGING

(71) Applicant: Siemens Healthcare GmbH, Erlangen (DE)

(72) Inventors: Flavio Carinci, Erlangen (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 58 days.

(21) Appl. No.: 16/001,224

(22) Filed: Jun. 6, 2018

(65) Prior Publication Data

US 2018/0348323 A1  Dec. 6, 2018

(30) Foreign Application Priority Data

Jun. 6, 2017 (EP) .................................. 17174507

(51) Int. Cl.
*G01R 33/483* (2006.01)
*G01R 33/385* (2006.01)
*G01R 33/561* (2006.01)

(52) U.S. Cl.
CPC ..... *G01R 33/4835* (2013.01); *G01R 33/3852* (2013.01); *G01R 33/5611* (2013.01)

(58) Field of Classification Search
CPC ............ G01R 33/4835; G01R 33/5611; G01R 33/3852
See application file for complete search history.

(56) References Cited

U.S. PATENT DOCUMENTS

| 6,289,232 B1 * | 9/2001 | Jakob ................. | G01R 33/5611 324/307 |
| 2006/0253018 A1 * | 11/2006 | Speier ................ | G01R 33/4824 600/410 |
| 2016/0041249 A1 * | 2/2016 | Lee .................... | G01R 33/4828 324/309 |
| 2016/0069974 A1 | 3/2016 | Lee et al. | |
| 2018/0074147 A1 | 3/2018 | Carinci et al. | |
| 2018/0095150 A1 | 4/2018 | Zeller | |

OTHER PUBLICATIONS

Zahneisen, et al. "Three-Dimensional Fourier Encoding of Simultaneously Excited Slices: Generalized Acquisition and Reconstruction Framework", Magnetic Resonance in Medicine, vol. 71, pp. 2071-2081 (2014).

(Continued)

*Primary Examiner* — Patrick Assouad
*Assistant Examiner* — Haidong Zhang
(74) *Attorney, Agent, or Firm* — Schiff Hardin LLP

(57) ABSTRACT

In a magnetic resonance slice multiplexing method and apparatus, measurements are performed repeatedly subject to the assignment of additional phases to the respective slices, the additionally assigned phases being changed with reach repetition such that at least one central k-space region is sampled completely in each of the repeated acquisitions. A calibration dataset is determined from the measurement data acquired completely in the central k-space region. The calibration dataset is used when reconstructing image data for the simultaneously excited slices from the acquired measurement data.

13 Claims, 4 Drawing Sheets

(56) References Cited

OTHER PUBLICATIONS

Kannengiesser, et al. "Motion Compensation Using Parallel Imaging Without Extra Reference Measurements and With Modified Reordering" in: International Society for Magnetic Resonance Medicine, Inc., vol. 11, p. 2149; (2004).
Setsompop, et al. "Blipped-Controlled Aliasing in Parallel Imaging (blipped-CAIPI) for simultaneous multi-slice EPI with reduced g-factor penalty"; Magnetic Resonance in Medicine; vol. 67; No. 5; pp. 1210-1224; (2012).
Breuer, et al., "Controlled Aliasing in Parallel Imaging Results in Higher Acceleration (CAIPIRINHA) for Multi-Slice Imaging", Magnetic Resonance in Medicine, 2005, vol. 53, No. 3, pp. 684-691, (2005).

* cited by examiner

FIG 3
i=1
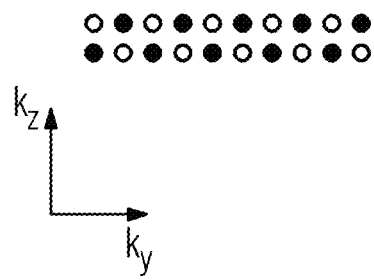
i=2
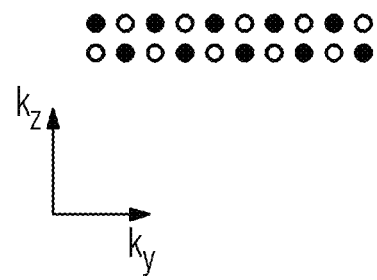
FIG 4
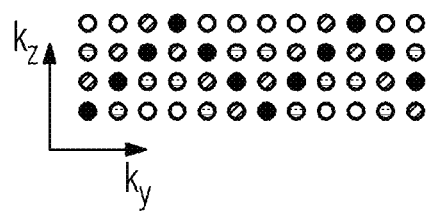

SLICE MULTIPLEXING METHOD AND APPARATUS FOR MAGNETIC RESONANCE IMAGING

BACKGROUND OF THE INVENTION

Field of the Invention

The present invention concerns a method for generating measurement data for at least two non-overlapping slices of an examination object by magnetic resonance (MR) technology using an MR data acquisition sequence, which determines measurement points on a k-space trajectory, and has at least one multiband RF excitation pulse, which excites the at least two non-overlapping slices simultaneously and selectively.

Description of the Prior Art

Magnetic resonance (MR) technology is a known modality, used to generate images of the interior of an examination object. In simple terms, to this end the examination object is positioned in a magnetic resonance scanner in a powerful static, homogeneous, constant magnetic field, also referred to as the $B_0$ field, with field strengths of 0.2 tesla to 7 tesla and more, so that nuclear spins in the object are oriented along the constant magnetic field. To trigger nuclear magnetic resonance, radio-frequency excitation pulses (RF pulses) are radiated into the examination object so as to trigger magnetic resonance signals that are detected and entered as complex numbers into a memory are referred to as k-space data, and MR images are reconstructed or spectroscopy data are determined from k-space data. To spatially encode the measurement data, the constant magnetic field is overlaid with rapidly switched magnetic gradient fields. The recorded measurement data are digitized and stored as complex numerical values in a k-space matrix. An associated MR image can be reconstructed from the value-populated k-space matrix, for example by means of a multidimensional Fourier transform.

In order to improve the signal to noise ratio (SNR) for MR measurements, or to reduce motion and/or flow sensitivity of the measurement, it is standard for multiple acquisitions be executed so as to acquire the measurement data multiple times, in order to be able to average the measurement data or for example the reconstructed image data.

The desire for ever faster MR acquisitions in the clinical environment is currently resulting in a renaissance for methods with which multiple images are acquired simultaneously. Generally such methods can be characterized by the fact that, at least during part of the measurement procedure, the transverse magnetization of at least two slices is used simultaneously for the imaging process (multi-slice imaging, slice multiplexing). In contrast to established multislice imaging, the signals from at least two slices are acquired alternately, in other words completely independently of one another, with a correspondingly longer measurement time.

An example of known methods for this purpose are Hadamard encoding, methods using simultaneous echo refocusing, methods using wideband data acquisition, and methods deploying parallel imaging in the slice direction. The last-mentioned methods include, for example, the CAIPIRINHA technique, as described by Breuer et al. in "Controlled Aliasing in Parallel Imaging Results in Higher Acceleration (CAIPIRINHA) for Multi-Slice Imaging", Magnetic Resonance in Medicine 53, 2005, pp 684-691, and the blipped CAIPIRINHA technique, as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pp 1210-1224.

With the last-mentioned slice multiplexing methods, a multiband RF pulse is used to excite or otherwise manipulate, for example to refocus or saturate, two or more slices simultaneously. Such a multiband RF pulse is a multiplex (superimposition) of individual RF pulses, which would be used to manipulate the single slices to be manipulated simultaneously. Multiplexing produces a baseband-modulated multiband RF pulse from the added pulse forms of the individual RF pulses. Spatial encoding of the acquired signals is achieved by standard gradient switching in two directions (two-dimensional gradient encoding).

The resulting signals are acquired using multiple reception antennas, and are collapsed from all the excited slices in one k-space dataset and then separated for the single slices with the use of parallel acquisition reconstruction techniques.

The cited parallel acquisition techniques are used to shorten the acquisition times. The acquisition times generally require to acquire the desired data use an incomplete (with respect to the Nyquist criterion) sampling, in other words an undersampling. The parallel acquisition techniques include, for example, GRAPPA ("GeneRalized Autocalibrating Partially Parallel Acquisition") and SENSE ("SENSitivity Encoding"). The measurement points in k-space that are not filled by a data entry in the undersampling are generally regularly distributed over k-space in parallel acquisition techniques, so that, for example, every other k-space line is filtered. The "missing" k-space data still contribute to the reconstruction with the use of coil sensitivity data in parallel acquisition techniques. This coil sensitivity data for the reception coils that are used when acquiring the measurement data is determined from reference measurement data, which samples at least one region of k-space, generally the central region, completely according to the Nyquist criterion.

With slice multiplexing methods, parallel acquisition techniques are used to separate again the measurement data entered in k-space, which were acquired simultaneously for different slices. Reference measurement data must be acquired for all the slices involved. This is generally done in an additional reference measurement, which detects reference measurement data individually for each desired slice.

In order to be able to separate the resulting signals acquired from the different slices, a different phase is assigned to each of the individual RF pulses before multiplexing, for example by adding a phase amount, which increases linearly (e.g. with k-space coordinate in the phase encoding direction ($k_y$)). This allows each slice to be assigned a different phase increase, with the result that the slices are displaced in relation to one another in the image domain. This shift is controlled by the FOV (field of view) shift factor. DE102016218955, published later, describes how an optimum FOV shift factor can be determined.

In the CAIPIRINHA methods described in the cited articles by Breuer et al. and Setsompop et al., switching additional gradient blips or additional modulation of the phases of the RF pulses causes the multiband RF pulses to be assigned further phase shifts that alternate between the simultaneously excited slices, which generate shifts in the image domain. These additional shifts in the image domain improve the quality of the separation of the signals from the slices, particularly if the coil sensitivities demonstrate such small differences in the sensitivity profiles of the individual coils so that they are not sufficient to separate the slices reliably. This reduces artifacts in the image data ultimately reconstructed from the measured measurement data.

FIG. 1 contrasts examples of different sampling schemes for k-space for GRAPPA-type parallel imaging techniques, in each instance with acceleration factor 2 and a three-dimensional (3D) Cartesian sampling scheme, which in each instance samples k-space lines in the $k_y$-$k_x$ plane. The $k_x$ direction, in which the illustrated k-space lines run in the example, is perpendicular to the plane of the drawing sheet, and the sampling scheme is always the same in the $k_x$ direction. The solid circles represent measured k-space points, the empty circles represent omitted (unfilled) k-space points. The left-side sampling scheme shows conventional GRAPPA sampling, where every other k-space line in one spatial direction (here the $k_z$ direction) is omitted, and thus only half of the points in k-space that are available to be filled with a data entry are actually filled.

The effect of the additional phase shifts on the sampling scheme of a two-dimensional (2D) slice multiplexing measurement can be described as illustrated in FIG. 1 on the right. The additional phases assigned in slice multiplexing CAIPIRINHA (Controlled Aliasing in Parallel Imaging Results in Higher Acceleration) technique methods cause the measurement points subject to the additional phase to be displaced by a shift in k-space in the $k_z$ direction. The size of this shift in the $k_z$ direction is a function of the assigned phase. This is also described in the article by Zahneisen et al.: "Three-Dimensional Fourier Encoding of Simultaneously Excited Slices: Generalized Acquisition and Reconstruction Framework", Magn. Reson. Med. 71, pp 2071-2081 (2014).

The reference data, from which the sensitivity data are obtained, conventionally must be measured additionally for every SMS measurement. The additional acquisition of the reference measurement data increases the acquisition time required overall and the SAR exposure (SAR: Specific Absorption Rate) when using a slice multiplexing method, and thus reduces the advantages of reduced measurement time and SAR exposure compared with single-slice methods, which are actually the goal of such methods.

Deviations in the measurement parameters used to acquire the reference measurement data from the measurement parameters used for multiband acquisition, in particular measurement parameters relating to the properties of the RF excitation pulses and/or relating to the read-out operation, for example the read-out bandwidth, can also influence the quality of the separation of the slices and produce unwanted artifacts. In this respect the U.S. patent application Ser. No. 15/262,233, published later, describes different methods for obtaining such reference measurement data in addition to the multiband measurement data, the reference data still having to be acquired in addition to the measurement data.

SUMMARY OF THE INVENTION

An object of the invention is to avoid the disadvantages resulting from the additional acquisition of reference measurement data as well as the acquisition of the multiband measurement data with MR slice multiplexing methods, without reducing the quality of the measurement data obtained, which has been separated for single slices.

In the inventive method for generating measurement data for at least two non-overlapping slices of an examination object by operation of a magnetic resonance scanner with a measurement sequence, measurement data are entered at points on a k-space trajectory in a memory organized as k-space, at least one multiband RF excitation pulse is radiated that excites the at least two non-overlapping slices simultaneously and selectively. Also in the invention method, phases are determined in a computer which are to be additionally assigned to each of the simultaneously excited slices during the course of the execution of the measurement sequence, so that at least a first of the measured k-space points is displaced in a k-space direction away from the original k-space trajectory of the measurement sequence according to the additionally assigned phases. The measurement data are acquired using a least two reception coils based on the measurement sequence, subject to assignment of the determined additional phases. The acquisition of measurement data with the at least two reception coils is repeated based on the measurement sequence, the phases to be additionally assigned being changed compared with the previous acquisition of measurement data such that at least a second of k-space points measured by the measurement sequence, not yet displaced away from the original k-space trajectory in the previously performed acquisitions, is displaced away from the original k-space trajectory in k-space direction. The acquisition of the measurement data is repeated, subject to this adjustment of the additional phases in each repetition, as many times as are necessary in order for at least one central k-space region to be sampled (filled) completely by the repeated acquisitions. The computer determines a calibration dataset from the measurement data acquired in this central k-space region. The computer reconstructs image data for the simultaneously excited slices from the acquired measurement data using the calibration dataset, and makes the image data available in electronic form, as a data file.

In the inventive slice multiplexing method, therefore, measurements are performed repeatedly subject to the assignment of additional phases, the additionally assigned phases being changed with reach repetition such that at least one central k-space region is sampled completely by the repeated acquisitions. A calibration dataset is determined from the measurement data acquired completely in the central k-space region, this calibration dataset being used when reconstructing image data for the simultaneously excited slices from the acquired measurement data. There is thus no need for the additional calibration measurements that are conventionally necessary, in order to determine calibration data with the inventive method.

If measurements are planned to be performed repeatedly, such as to improve, by averaging, the quality of the obtained measurement and/or image data, the measurement time with the inventive method is not extended by calibration measurements.

With the inventive method, calibration data are determined from the same measurement data, from which the desired image data are also reconstructed. The measurement parameters of the measurement data, from which the calibration data are determined, and the measurement parameters of the measurement data, from which image data are reconstructed, are therefore identical, with the result that the calibration data are inherently matched to the measurement data, which is to be supplemented using the calibration data. This effectively prevents artifacts.

An inventive magnetic resonance has an MR data acquisition scanner that has a basic field magnet, a gradient coil arrangement, a radio-frequency antenna and a control computer with a radio-frequency transmit/receive controller with a multiband RF pulse unit configured to perform the inventive method.

The present invention also encompasses a non-transitory, computer-readable data storage medium encoded with programming instructions that, when the storage medium is loaded into a control computer or computer system of a magnetic resonance apparatus, cause the computer or computer system to operate the magnetic resonance apparatus in order to implement any or all embodiments of the method according to the invention, as described above.

The advantages and embodiments cited in relation to the method apply in a similar manner to the magnetic resonance apparatus and the electronically readable data storage medium.

BRIEF DESCRIPTION OF THE DRAWINGS

FIG. 3 schematically illustrates an example of inventive k-space sampling.

FIG. 4 schematically illustrates another example of inventive k-space sampling.

DESCRIPTION OF THE PREFERRED EMBODIMENTS

Figure 2:
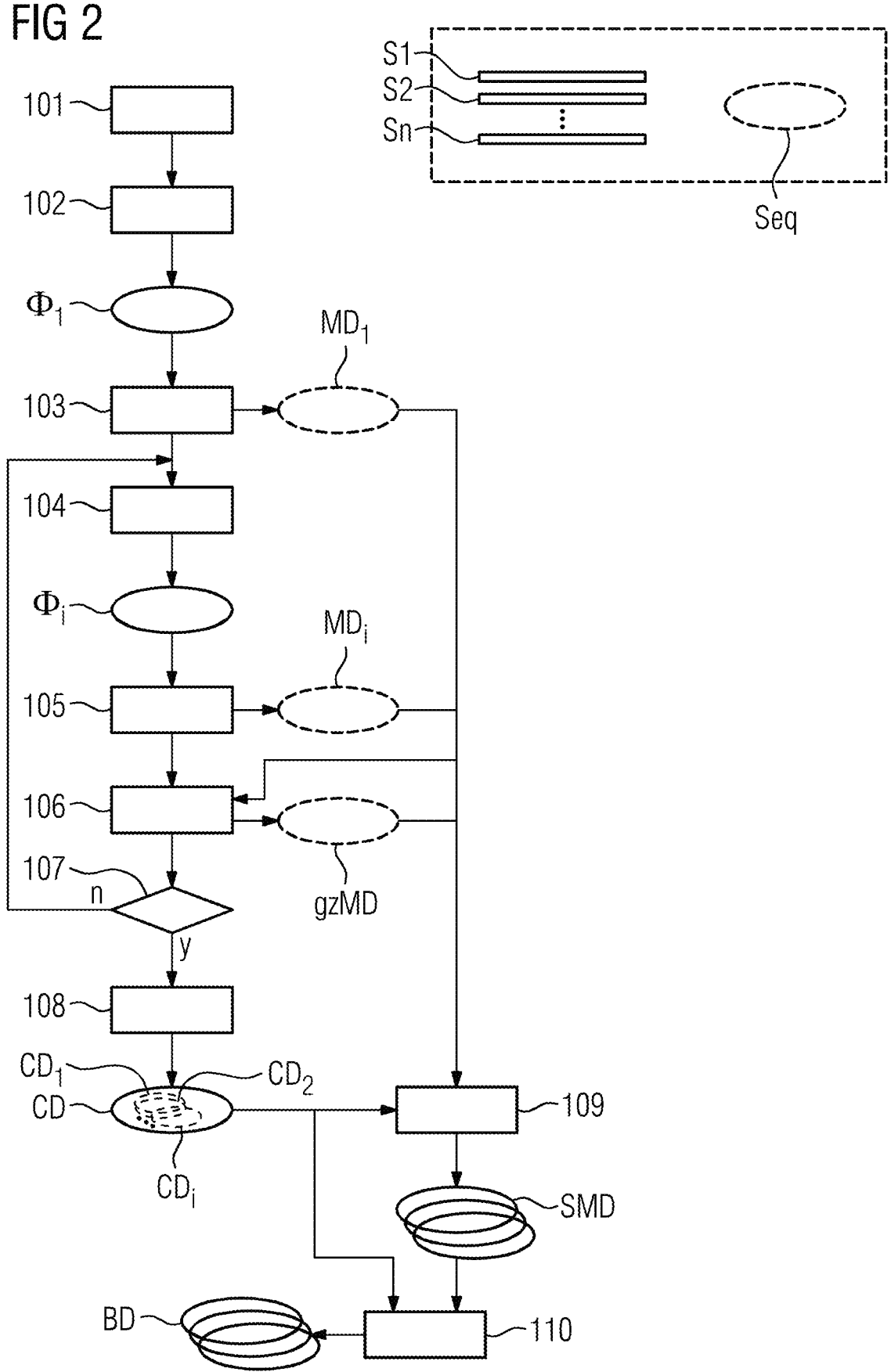
FIG. 2 is a flowchart of the inventive method.

FIG. 2 is a flowchart of the inventive method for generating measurement data for at least two non-overlapping slices Sn (n≥2) of an examination object by magnetic resonance technology.

The measurement data are acquired here based on a measurement sequence Seq, which determines measurement points on a k-space trajectory, and includes at least one multiband RF excitation pulse, which excites the at least two non-overlapping slices Sn simultaneously and selectively.

The measurement sequence Seq determines the RF pulses to be essentially radiated, gradients to be switched, and read-out operations, as well as their time sequence. This therefore determines k-space trajectory, along which k-space is sampled during acquisition of the measurement points.

The measurement sequence Seq can be a standard two-dimensional measurement sequence for the acquisition of measurement data in slices, in which k-space trajectory determined by the measurement sequence lies in a plane in k-space. K-space direction, in which measurement points are displaced by assigning the additional phase, can then be perpendicular to this plane of k-space trajectory, in order to be able to cover the multiple slices. Such selection of the measurement sequence Seq facilitates implementation of the inventive method on magnetic resonance systems, as such measurement sequences are generally already available and it is thus possible to access existing protocols, in particular those of CAIPIRINHA methods.

Phases to be additionally assigned $\phi_1$ are determined in a computer, the determined phases being assigned to each of the simultaneously excited slices Sn during the course of a (first) execution of the measurement sequence Seq (i=1) (Block 102), the index i counting the repetitions of the acquisition of measurement data using the measurement sequence Seq. The assigning of the additional phases $\phi_1$ means that at least a first of the measured k-space points is displaced away from the original k-space trajectory of the measurement sequence Seq in a k-space direction in the area of k-space that is sampled as part of an acquisition of measurement data using the measurement sequence Seq, and subject to assignment of the determined additional phases $\phi_1$. A specific additional phase can be determined for each of the simultaneously excited slices Sn, so that no two of the simultaneously excited slices Sn are assigned the same additional phase $\phi_1$.

The k-space direction, in which the at least one k-space point of k-space trajectory is displaced, can correspond to the slice direction ($k_z$) in k-space.

The additional phases $\phi_1$ can be assigned, for example, by additional gradients to be switched and/or by manipulation of the phases of the single RF pulses of the multiband RF excitation pulses used. In particular, the additional phases $\phi_1$ can be assigned according to a CAIPIRINHA method.

To this end, a desired shift in the image space can be determined (Block 101) and the determined phases to be additionally assigned $\phi_1$ can be determined such that they introduce the desired shift in the image space into the acquired measurement data $MD_1$.

A desired shift in the image space can be determined by the computer for each of the slices Sn, by which, in each instance, one slice of the simultaneously excited slices Sn is to be displaced in the image domain, after a transformation of the measurement data $MD_1$ containing all the slices Sn into the image domain, so that the slices Sn in the image domain are each displaced relative to one another. The phases $\phi_1$ to be additionally assigned, determined for each of the simultaneously excited slices Sn, are determined so as to produce the desired respective shift in the image domain for each of the simultaneously excited slices Sn in the acquired measurement data $MD_1$ containing all the simultaneously excited slices Sn.

The desired shift in the image space can be determined, for example, based on the number N of simultaneously excited slices Sn. This can be done by each of the simultaneously excited slices Sn being shifted by a multiple of the Nth part of the field of view FOV, for example by $$(n-1)\frac{FOV}{N}.$$

As described in the article by Zahneisen et al. cited above, such a selection of the desired shift in the image domain results in a shift of the measured k-space points in k-space (in the $k_z$ direction) by an amount that corresponds to complete sampling according to Nyquist in that k-space direction. Thus a 2D slice multiplexing measurement can be considered to be the same as a 3D CAIPIRINHA measurement.

The desired shift in the image space, however, can also take place according to a method in DE102016218955 cited above.

With the method described in FIG. 2 measurement data $MD_1$ are acquired as part of a first acquisition using at least two reception coils based in the measurement sequence Seq subject to assignment of the determined additional phases $\phi_1$ (Block 103).

The acquisition of measurement data with the at least two reception coils based on the measurement sequence Seq is repeated (Block 105), with the result that further measurement data $MD_i$ is acquired. With such repeated acquisition of measurement data (i≥2) phases to be additionally assigned $\phi_i$ are changed compared with the previous acquisition of measurement data with index j<i in such that at least a second of k-space points measured by the measurement sequence Seq, not yet displaced away from the original k-space trajectory in the previously performed acquisitions, is displaced away from the original k-space trajectory in k-space direction. A determination of the phases to be additionally assigned $\phi_i$ to be used for a repetition (Block 104) can take place by taking into account k-space points already displaced at least once in previous acquisitions. The determination of the phases to be additionally assigned, which are to be used for a particular repetition, can additionally or alternatively take into account which k-space points have not yet been acquired for the desired complete sampling at least in the central k-space region. This keeps the number of repetitions to be performed as low as possible.

One example of a determination of a phase $\phi_1$ additionally assigned for a repetition is described with reference to FIG. 3, in which the principle of k-space sampling is illustrated as an example with a field of view region shift factor of $$\frac{FOV}{2}$$

for a first acquisition (i=1) and a repetition of the acquisition (i=2). Here, as in FIG. 1, the $k_x$ direction is perpendicular to the plane of the paper. FIG. 3 therefore shows a Cartesian sampling scheme. The method can also be applied in a similar manner for non-Cartesian sampling schemes, for example radial or spiral sampling schemes.

Figure 1:
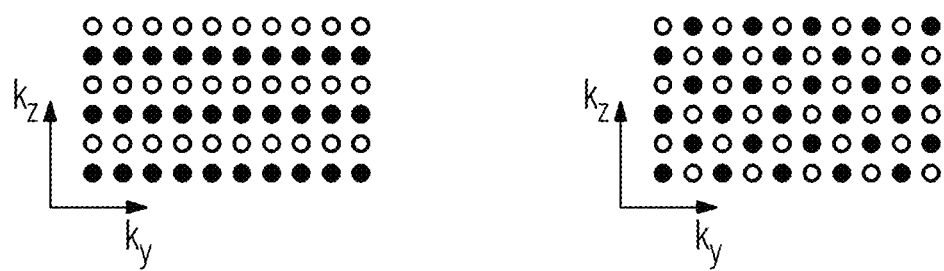
FIG. 1 is a schematic comparison of different k-space sampling schemes for parallel acquisition techniques.

In FIG. 3, as in FIG. 1, acquired k-space points are shown as black circles, while k-space points that have not been acquired are shown as white circles. In the first acquisition shown on the left every other k-space point is displaced in $k_y$ direction by additionally assigned phases $\phi_1$ in $k_z$ direction. This can be done, for example, by applying a CAIPIR-INHA technique. In the repetition shown on the right the additional phases $\phi_i$ are changed in such a manner that every other k-space point is shifted in the $k_y$ direction again by additionally assigned phases $\phi_2$ in $k_z$ direction but in the repetition k-space points that were not displaced in the first acquisition are displaced in $k_z$ direction. In the illustrated example it is therefore possible to achieve the desired complete k-space sampling even for the entire k-space by simply swapping k-space points populated with additional phases $\phi_i$ in repetitions of the acquisition.

Such swapping of k-space points subject to additional phases can take place in the same manner for other acceleration factors and/or field of view shift factors, the number of repetitions required for an, at least partially, complete sampling being a function of the acceleration factors and field of view shift factors used.

For example, with a field of view shift factor of $$\frac{FOV}{3}$$

and an otherwise similar sampling scheme the desired k-space region could be sampled completely in three repetitions, in which k-space points populated with additionally assigned phases $\phi_i$ are respectively permuted.

A further example of swapping k-space points subject to the additional phases is shown in FIG. 4. This shows a sampling scheme for a field of view shift factor of $$\frac{FOV}{4},$$

with which the phases to be additionally assigned are distributed over a total of four repetitions of the acquisition of the measurement data in such a manner that the desired k-space region is sampled completely by the four acquisitions. In FIG. 4 k-space points measured in one acquisition are shown as identically filled in circles. For example in a first acquisition k-space points shown as black circles are measured, in a second acquisition k-space points shown as circles with a stripe from bottom left to top right are measured, in a third acquisition k-space points shown as circles with horizontal stripes are measured and in a fourth acquisition k-space points shown as white circles are measured.

With each repetition of the acquisition of measurement data the use of the same measurement sequence means that the same number of k-space points is sampled each time.

Such an acquisition of measurement data $MD_i$ with respectively adjusted phases to be additionally assigned $\phi_i$ is repeated so often and with phases to be additionally assigned $\phi_i$ that are adjusted in such a manner in each instance that at least a central k-space region is sampled completely according to Nyquist as part of the repeated acquisitions (Query 107).

If the measurement sequence is selected in such a manner that k-space trajectory determined by the measurement sequence allows a complete sampling of k-space according to Nyquist, fewer repetitions are needed to sample the central k-space region completely.

To this end a total measurement dataset gzMD is formed from the previously acquired measurement data $MD_i$, containing at least all the previously measured measurement data in a predefined central k-space region, or even all the previously measured measurement data $MD_i$ (Block 106).

If the answer to Query 107 is that the central k-space region has not yet been sampled completely by the previously performed repetitions ("n"), a new repetition is started with new phases to be additionally assigned $\phi_i$ (Block 104).

If the answer to Query 107 is that the central k-space region has already been sampled completely by the previously performed repetitions ("y"), a calibration dataset CD is determined from the complete measurement data acquired in the central k-space region (Block 108).

An acquisition calibration dataset $CD_i$ can be determined for each or at least two of the items of measurement data $MD_i$ acquired as part of one acquisition, different k-space points of the actual k-space trajectory being displaced in k-space direction therein, the respectively displaced k-space points which are therefore missing from the original k-space trajectory being able to be reconstructed with this. The calibration dataset CD can thus contain multiple acquisition calibration datasets $CD_i$.

Image data BD of the simultaneously excited slices Sn are reconstructed from the acquired measurement data $MD_i$ (i=1, 2, . . . ) using the calibration dataset CD (Block 110). At least one image dataset BD is reconstructed here for each of the simultaneously excited slices Sn.

Reconstruction of the image data involves separation of the acquired measurement data into at least one slice measurement dataset SMD for each simultaneously excited slice Sn (Block 109).

Such separation of the acquired measurement data can be performed based on a parallel acquisition technique, for example a slice GRAPPA method, as described in the article by Breuer et al. cited above, using the calibration dataset CD. Such separation can take place separately for the measurement data $MD_i$ acquired in each instance as part of one acquisition, for example with an associated acquisition calibration dataset $CD_i$, allowing associated slice measurement datasets SMD to be generated for each simultaneously excited slice Sn for each acquisition. This allows multiple slice measurement datasets SMD to be generated for each simultaneously excited slice. The phases $\phi_1$ to be additionally assigned, which have been adjusted with each repetition and therefore changed, increase the variation of the additional phases used in the acquisitions, which already improves the robustness of the separation of the slices by means of parallel acquisition techniques.

If the stored total measurement dataset gzMD in k-space direction, in which k-space points are displaced by the additional phases $\phi_i$, e.g. the slice direction $k_z$, is complete according to Nyquist, an associated slice measurement dataset SMD can be extracted from the total measurement dataset by applying a Fourier transform in the direction corresponding to the shift for each excited slice and then stored.

No calibration data are required here to separate the measurement data into slice measurement data. The calibration data can be used to supplement missing measurement data in the plane of k-space trajectory of the measurement sequence, for example to supplement measurement data undersampled in the phase encoding direction.

Reconstruction of the image data can involve separating the acquired measurement data into at least two slice measurement datasets SMD for each simultaneously excited slice Sn. For example a slice measurement dataset SMD can be separated out from multiple measurement data $MD_i$ acquired for each acquisition for each of the simultaneously excited slices Sn.

The slice measurement datasets SMD themselves can be incomplete according to Nyquist. K-space points that are missing according to Nyquist can then be reconstructed using a parallel acquisition technique and the calibration dataset CD and supplemented in the slice measurement datasets. The reconstruction of the image data can thus includes such supplementing of incomplete slice measurement datasets SMD.

If multiple slice measurement datasets SMD have been determined for each simultaneously excited slice Sn, the reconstruction of the image data BD can include an averaging of at least two of the slice measurement datasets SMD of at least one of the simultaneously excited slices Sn respectively to provide an averaged slice measurement dataset of the respective slice.

Additionally or alternatively, reconstruction of the image data BD can include an averaging of the image data reconstructed from multiple slice measurement datasets SMD of a slice for the respective slice.

Such averaging improves the quality of the image data ultimately obtained, by reducing sensitivity to motion of the examination object, for example also respiratory motion or cardiac pulse motion, and improves the SNR.

Reconstruction of the image data can also include measures to compensate for undesirable phase offsets that may possibly occur due to the additionally assigned phases.

Figure 5:
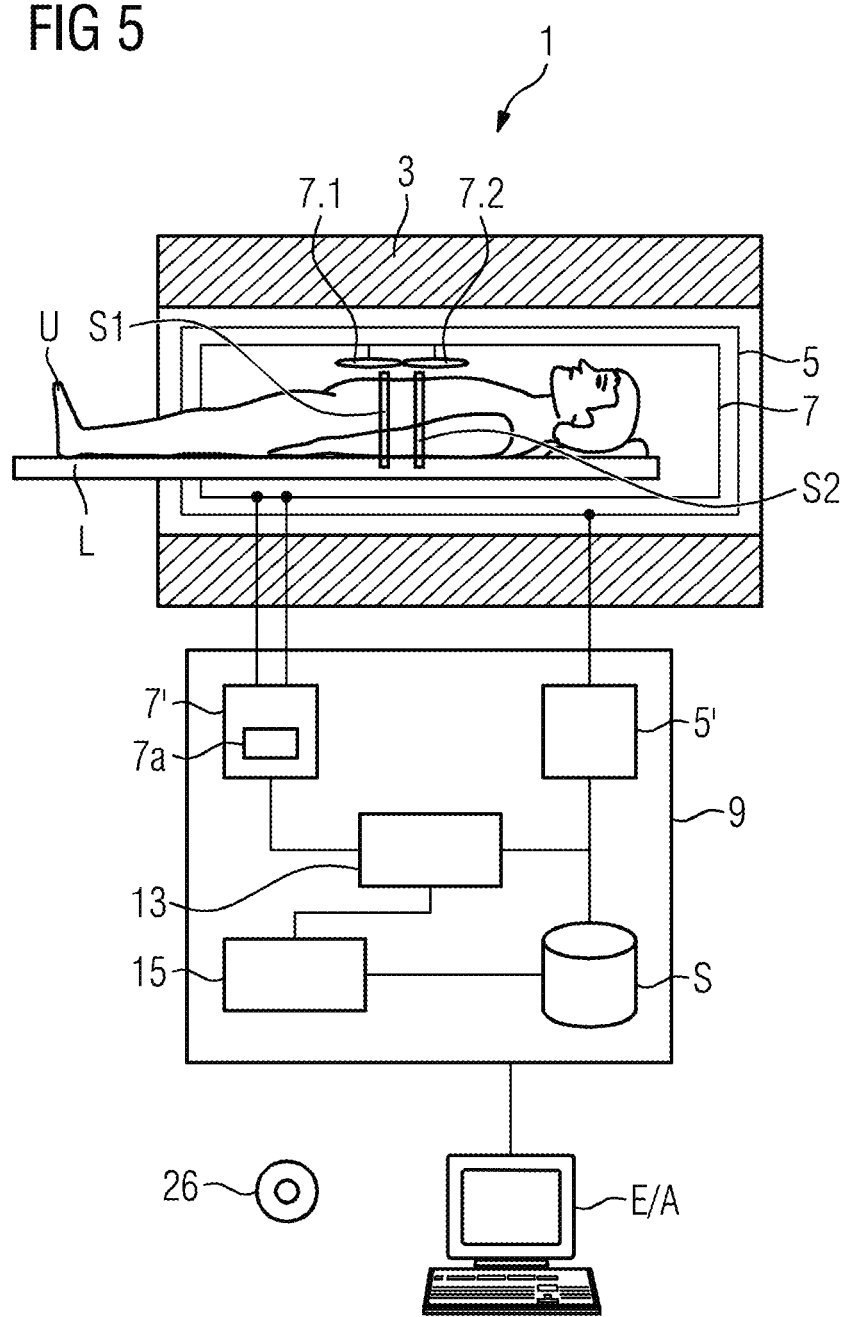
FIG. 5 schematically illustrates the inventive magnetic resonance system.

FIG. 5 schematically shows an inventive magnetic resonance (MR) apparatus 1. The MR apparatus 1 has an MR data acquisition scanner with a basic field magnet 3 that generates the constant magnetic field, a gradient coil arrangement 5 that generates the gradient fields, a radio-frequency antenna 7 for radiating and receiving radio-frequency signals, and a control computer 9 configured to perform the inventive method. In FIG. 5 such sub-units of the magnetic resonance apparatus 1 are only outlined schematically. The radio-frequency antenna 7 is composed of multiple sub-units, in particular at least two coils, for example the schematically shown coils 7.1 and 7.2, which can be configured either only to transmit radio-frequency signals or only to receive the triggered radio-frequency signals (MR signals), triggered or to do both.

In order to acquire MR data from an examination object U, for example a patient or a phantom, the examination object U is introduced on a bed L into the measurement volume of the scanner. The slices S1 and S2 are examples of two different slices of the examination object, from which MR data can be acquired simultaneously.

The control computer 9 centrally controls the magnetic resonance apparatus, and can control the gradient coil arrangement 5 with a gradient controller 5' and the radio-frequency antenna 7 with a radio-frequency transmit/receive controller 7'. The radio-frequency antenna 7 has multiple channels, in which signals can be transmitted or received.

The radio-frequency antenna 7 together with its radio-frequency transmit/receive controller 7' is responsible for generating and radiating (transmitting) a radio-frequency alternating field for manipulating the nuclear spins in a region to be examined (in particular in different slices S1 and S2) of the examination object U. The center frequency of the radio-frequency alternating field, also referred to as the B1 field, here should be close to the resonant frequency of the nuclear spins to be manipulated. To generate the B1 field, currents controlled by the radio-frequency transmit/receive controller 7' are applied to the RF coils in the radio-frequency antenna 7.

The control computer 9 also has a phase determination processor 15 that determines phases $\phi_1$ to be additionally assigned according to the invention.

A computation processor 13 of the control computer 9 is configured to execute all the computation operations required for the required measurements and determinations. Intermediate results and final results required for this purpose or determined in the process can be stored in a memory S of the control computer 9. The units shown here should not necessarily be considered as physically separate units, but simply represent a subdivision into functional units, which can also be implemented by fewer physical units, or just one.

A user can enter control commands into the magnetic resonance apparatus 1 and/or view displayed results, for example image data, from the control computer 9 via an input/output interface E/A.

A non-transitory, data storage medium 26 can be loaded into the control computer 9, and is encoded with programming instructions (program code) that cause the control computer 9, and the various functional units thereof described above, to implement any or all embodiments of the method according to the invention, as also described above.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for magnetic resonance (MR) imaging of at least two non-overlapping slices of an examination object, said method comprising:

from a computer, emitting control signals to an MR data acquisition scanner in order to cause the MR data acquisition scanner to execute an MR data acquisition sequence in which acquired MR data are entered into a memory organized as k-space along a k-space trajectory, and in order to radiate at least one multiband radio-frequency (RF) excitation pulse that selectively and simultaneously excites nuclear spins in at least two non-overlapping slices of an examination subject situated in the MR data acquisition scanner;

in said computer, determining phases that are to be additionally assigned to each of the simultaneously excited slices during execution of said MR data acquisition sequence, so as to displace at least a first of the measurement points for a respective slice to be displaced away from said k-space trajectory of the MR data acquisition sequence, in a direction in k-space corresponding to the additionally assigned phase for that respective slice;

using said computer to operate said MR data acquisition scanner to execute said MR data acquisition sequence with the assignment of the determined additional phases in order to acquire MR data from the respective slices with at least two RF reception coils;

using said computer to emit control signals to operate said MR data acquisition scanner in order to repeat acquisition of said MR data with said at least two RF reception coils in said MR data acquisition sequence with the phases that are additionally assigned being changed from repetition-to-repetition so that, compared with a previous acquisition of said MR data, at least a second of the measurement points in a respective repetition of the MR data acquisition sequence, that have not yet been displaced away from said k-space trajectory in previous repetitions, are displaced away from k-space trajectory in said direction in k-space, with said repetitions of said MR data acquisition sequence being repeated with a number of repetitions that causes at least one central region of k-space to be sampled completely by the repeated MR data acquisitions;

in said computer, determining a calibration dataset from the measurement data acquired in said central region of k-space; and in said computer, reconstructing image data for the simultaneously excited slices from the acquired measurement data using said calibration dataset, and making the image data available from the computer in electronic form, as a data file.

2. A method as claimed in claim 1 comprising, in said computer, determining a different phase that is to be additionally assigned for each of the simultaneously excited slices.

3. A method as claimed in claim 1 comprising assigning the additional phases to the respective slices by emitting control signals from said computer to said data acquisition scanner that cause at least one of activation of additional gradients, and manipulation of phases of individual RF pulses of which said multiband RF excitation pulse is comprised.

4. A method as claimed in claim 1 comprising assigning said additional phases according to a CAIPIRINHA method.

5. A method as claimed in claim 1 comprising determining said k-space trajectory so as to be in a plane in k-space, and determining said direction in k-space, in which said measurement points are displaced by the assigned additional phase, so as to be perpendicular to the plane of said k-space trajectory.

6. A method as claimed in claim 1 comprising, in said computer, determining a predetermined shift in the image domain, in which said image data exist, and determining said phases to be additionally assigned so as to produce said predetermined shift in the image domain by the acquired measurement data.

7. A method as claimed in claim 6 comprising determining said predetermined shift in the image domain based on a number of said slices from which said MR data are simultaneously acquired.

8. A method as claimed in claim 1 comprising, when reconstructing said image data, separating the acquired measurement data in k-space into at least one slice measurement dataset for each of the slices from which said MR data were simultaneously acquired.

9. A method as claimed in claim 8 comprising implementing said separation using a parallel acquisition technique.

10. A method as claimed in claim 8 comprising entering the acquired MR data into k-space so that each slice measurement dataset is acquired in said direction of k-space, in which said measurement points are displaced by said additional phase, is complete according to the Nyquist criterion and, in said computer, extracting an associated slice measurement dataset from the respective slice measurement dataset by applying a Fourier transform thereto in a direction corresponding to said shift.

11. A method as claimed in claim 8 comprising reconstructing said image data by separating the acquired measurement data into at least two slice measurement datasets for each of said slices, and averaging at least two of said slice measurement datasets of at least one slice, or averaging the image data reconstructed from the slice measurement datasets of at least one slice.

12. A magnetic resonance (MR) apparatus comprising:
an MR data acquisition scanner;
a computer configured to emit control signals to said MR data acquisition scanner in order to cause the MR data acquisition scanner to execute an MR data acquisition sequence in which acquired MR data are entered into a memory organized as k-space along a k-space trajectory, and in order to radiate at least one multiband radio-frequency (RF) excitation pulse that selectively and simultaneously excites nuclear spins in at least two non-overlapping slices of an examination subject situated in the MR data acquisition scanner;

said computer being configured to determine phases that are to be additionally assigned to each of the simultaneously excited slices during execution of said MR data acquisition sequence, so as to displace at least a first of the measurement points for a respective slice to be displaced away from said k-space trajectory of the MR data acquisition sequence, in a direction in k-space corresponding to the additionally assigned phase for that respective slice;

said computer being configured to operate said MR data acquisition scanner to execute said MR data acquisition sequence with the assignment of the determined additional phases in order to acquire MR data from the respective slices with at least two RF reception coils;

said computer being configured to emit control signals to operate said MR data acquisition scanner in order to repeat acquisition of said MR data with said at least two RF reception coils in said MR data acquisition sequence with the phases that are additionally assigned being changed from repetition-to-repetition so that, compared with a previous acquisition of said MR data, at least a second of the measurement points in a respective repetition of the MR data acquisition sequence, that have not yet been displaced away from said k-space trajectory in previous repetitions, are displaced away from k-space trajectory in said direction in k-space, with said repetitions of said MR data acquisition sequence being repeated with a number of repetitions that causes at least one central region of k-space to be sampled completely by the repeated MR data acquisitions;

said computer being configured to determine a calibration dataset from the measurement data acquired in said central region of k-space; and said computer being configured to reconstruct image data for the simultaneously excited slices from the acquired measurement data using said calibration dataset, and to make the image data available from the computer in electronic form, as a data file.

13. A non-transitory, computer-readable data storage medium encoded with programming instructions, said storage medium being loaded into a computer of a magnetic resonance (MR) apparatus that comprises an MR data acquisition scanner, and said programming instructions causing said computer system to:

emitting control signals to said MR data acquisition scanner in order to cause the MR data acquisition scanner to execute an MR data acquisition sequence in which acquired MR data are entered into a memory organized as k-space along a k-space trajectory, and in order to radiate at least one multiband radio-frequency (RF) excitation pulse that selectively and simultaneously excites nuclear spins in at least two non-overlapping slices of an examination subject situated in the MR data acquisition scanner;

determine phases that are to be additionally assigned to each of the simultaneously excited slices during execution of said MR data acquisition sequence, so as to displace at least a first of the measurement points for a respective slice to be displaced away from said k-space trajectory of the MR data acquisition sequence, in a direction in k-space corresponding to the additionally assigned phase for that respective slice;

operate said MR data acquisition scanner to execute said MR data acquisition sequence with the assignment of the determined additional phases in order to acquire MR data from the respective slices with at least two RF reception coils;

emit control signals to operate said MR data acquisition scanner in order to repeat acquisition of said MR data with said at least two RF reception coils in said MR data acquisition sequence with the phases that are additionally assigned being changed from repetition-to-repetition so that, compared with a previous acquisition of said MR data, at least a second of the measurement points in a respective repetition of the MR data acquisition sequence, that have not yet been displaced away from said k-space trajectory in previous repetitions, are displaced away from k-space trajectory in said direction in k-space, with said repetitions of said MR data acquisition sequence being repeated with a number of repetitions that causes at least one central region of k-space to be sampled completely by the repeated MR data acquisitions;

determine a calibration dataset from the measurement data acquired in said central region of k-space; and reconstruct image data for the simultaneously excited slices from the acquired measurement data using said calibration dataset, and make the image data available from the computer in electronic form, as a data file.

* * * * *